United States Patent
Kwak et al.

(10) Patent No.: US 6,853,226 B2
(45) Date of Patent: Feb. 8, 2005

(54) REGISTER CONTROLLED DELAY LOCKED LOOP HAVING AN ACCELERATION MODE

(75) Inventors: Jong-Tae Kwak, Kyoungki-do (KR); Seong-Hoon Lee, Kyoungki-do (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 0 days.

(21) Appl. No.: 10/619,353

(22) Filed: Jul. 14, 2003

(65) Prior Publication Data

US 2004/0085107 A1 May 6, 2004

(30) Foreign Application Priority Data

Oct. 30, 2002 (KR) ................................. 10-2002-0066443
May 28, 2003 (KR) ................................. 10-2003-0034168

(51) Int. Cl.[7] ................................................ H03L 7/06
(52) U.S. Cl. ...................... 327/159; 327/161; 375/376
(58) Field of Search ................................. 327/149, 147, 327/158–161; 331/1 A, DIG. 2; 375/373–376

(56) References Cited

U.S. PATENT DOCUMENTS

| | | | |
|---|---|---|---|
| 5,502,680 A | 3/1996 | Du et al. ................... 365/205 |
| 5,550,514 A | * 8/1996 | Liedberg ..................... 331/1 A |
| 5,969,551 A | * 10/1999 | Fujioka ....................... 327/149 |
| 6,049,239 A | * 4/2000 | Eto et al. ..................... 327/158 |
| 6,194,930 B1 | * 2/2001 | Matsuzaki et al. .......... 327/156 |
| 6,342,796 B2 | * 1/2002 | Jung ........................... 327/141 |
| 6,438,060 B1 | 8/2002 | Li et al. ...................... 365/227 |
| 6,445,234 B1 | 9/2002 | Yoon et al. .................. 327/161 |
| 6,486,716 B1 | * 11/2002 | Minami et al. ............. 327/152 |
| 2002/0075048 A1 | 6/2002 | Miyamoto |
| 2002/0110035 A1 | 8/2002 | Li et al. |
| 2002/0181299 A1 | 12/2002 | Li et al. |
| 2003/0001637 A1 | 1/2003 | Jung |
| 2003/0002357 A1 | 1/2003 | Kwon et al. |

FOREIGN PATENT DOCUMENTS

JP     2001-023367     1/2001

* cited by examiner

Primary Examiner—Minh Nguyen
(74) Attorney, Agent, or Firm—Marshall, Gerstein & Borun LLP

(57) ABSTRACT

A register controlled delay locked loop having an acceleration mode corresponding to an increase of the operation speed of a memory device is used to improve accuracy. The register controlled delay locked loop includes a delay line, a delay model, a delay block, a first phase comparator, and a second phase comparator, a mode decision block, a shift register control block, and a shift register.

12 Claims, 10 Drawing Sheets

FIG. 7B
PAST UNDERGOING ACCELERATION MODE K TIMES
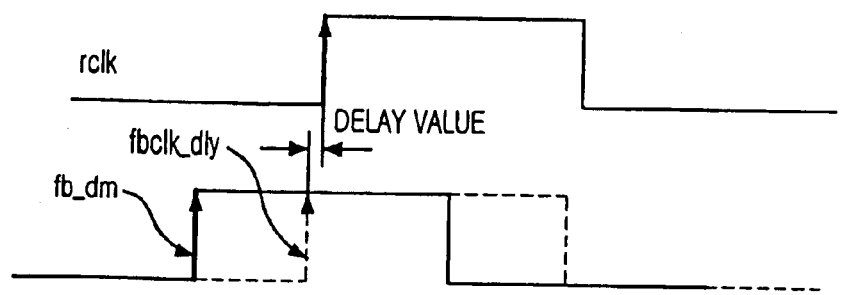
PAST UNDERGOING ACCELERATION MODE K+1 TIMES
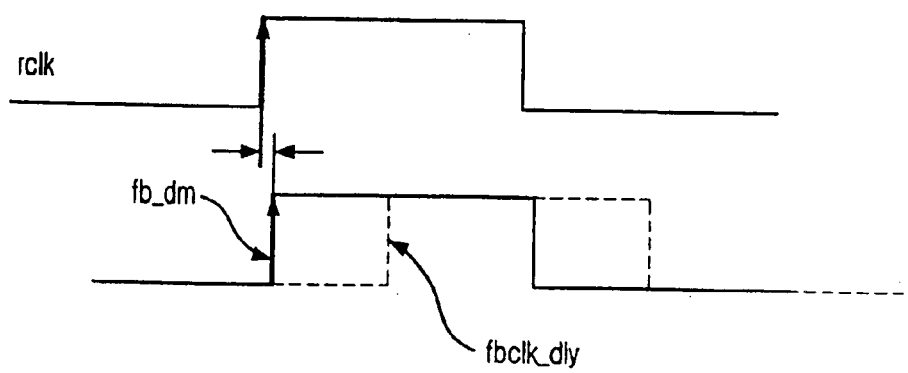

US 6,853,226 B2

1

REGISTER CONTROLLED DELAY LOCKED LOOP HAVING AN ACCELERATION MODE

FIELD OF THE INVENTION

The present disclosure relates to a semiconductor circuit technique and, more particularly, to a register controlled delay locked loop DLL having an acceleration mode.

DESCRIPTION OF RELATED ART

Generally, a clock signal of a system or a circuit is used as a reference for synchronizing an execution timing and guaranteeing an error-free high speed operation. When an external clock signal of an external circuit is used in an internal circuit, a clock signal skew is generated from an internal circuit because of timing gap between the external clock signal and the internal clock signal. A delay locked loop (hereinafter, referred as DLL) compensates the clock signal skew for equalizing a phase of the internal clock signal to that of the external clock signal.

In addition, the DDL are broadly used in a synchronous semiconductor memory device including a double data rate synchronous dynamic random access memory (DDR SDRAM) because it has an advantage with being less affected by a noise, as compared to a phase locked loop (hereinafter, referred as PLL) Among various types of the DLL, a register controlled DLL is the most generally used.

The register controlled DLL in the synchronous semiconductor memory device synchronizes a data output with the external clock signal by fore-reflecting a negative delay after receiving the external clock signal and compensating a delay value of data and clock signal paths.

FIG. 1 is a block diagram showing a conventional register controlled DLL of the DDR SDRAM. The register controlled DLL uses non-delayed input clock signals fclk and rclk outputted from a first and a second clock signal input buffers 11 and 12. After buffering a sub-external clock signal /CLK, the first clock signal input buffer 11 generates the non-delayed input clock signal fclk synchronized with a rising edge of the sub-external clock signal /CLK and a falling edge of an external clock signal CLK. The second clock signal input buffer 12 generates the non-delayed input clock signal rclk synchronized with a rising edge of the external clock signal CLK, after buffering the sub-external clock signal /CLK.

As shown, the register conventional controlled DLL in accordance with the prior art includes a clock signal divider 13, a first delay line 14, a second delay line 15, a third delay line 16, a shift register 22, a first DLL driver 17, a second DLL driver 18, a delay model 19, a phase comparator 20, and a shift register controller 21.

The clock signal divider 13 outputs a delay monitoring clock signal fb_div and a reference clock signal ref, dividing the non-delayed input clock signal rclk by 1/M where M is a positive constant. In this case, M=8. The first delay line 14, the second delay line 14 and the third delay line 16 receive the two non-delayed input clock signals fclk and rclk and the delay monitoring clock signal fb_div. The shift register 22 determines delay values of the first to the third delay lines 14, 15 and 16. The first DLL driver 17 generates a first DLL clock signal fclk_dll after receiving an output fclk_dl of the line 14. If a delay is locked, the second DLL driver 18 generates a second DLL clock signal rclk_dll after receiving an output rclk_dl of the second delay line 15. The delay model 19 reflects the delay values of actual clock

2 signal and data paths after receiving an output from the third delay line 14. The phase comparator 20 compares a phase of an output fb_dm from the delay model 19 with a phase of the reference clock signal ref. The shift register controller 21 manages a shift direction of the shift register 22 in response to an output from the phase comparator 20.

Herein, execution of the register controlled DLL including the above described elements will be simply described.

First, the clock signal dividing 13 makes the reference clock signal ref and the delay monitoring clock signal fb_div, that are once synchronized at every M timing of the external clock signal CLK, by dividing the non-delayed input clock signal rclk by 1/M. The reference clock signal ref has an opposite phase to the phase of the delay monitoring clock signal fb_div.

For a start of the execution, the delay monitoring clock signal fb_div is outputted for a pre-decided delay value by the delay model 19 after passing through a delay cell unit of the third delay line 16.

Meanwhile, the phase comparator 20 compares a rising edge of the reference clock signal ref with that of the output clock signal fb_dm of the delay model 19, and the shift register controller 21 outputs shift control signals such as a shift right SR and a shift left SL for controlling a shift direction of the shift register 22 in response to an output of the phase comparator 20.

The shift register 22 determines delay values of the first, second, and third delay lines 14, 15, and 16 by enabling one delay cell unit of many delay cells including the first, second, and third delay lines 14, 15, and 16 in response to the shift control signals SR and SL. At this time, if the SR is enabled, a value of the shift register 22 moves to the right and, on the other hand, if the SL is enabled, the value of the shift register 22 moves to the left.

After then, as comparing the reference clock signal ref and the output clock signal fb_dm of the delay model 19 of which delay value is limited, the delay is determined to be locked at the timing in which there is the smallest jitter between these two clock signals ref and fb_dm. At that time, the first and second DLL driver 17 and 18 are enabled so as to output the DLL clock signals fclk_dll and rclk_dll, which have the sub-external clock signal /CLK and the external clock signal CLK respectively.

The register controlled DLL adopts an acceleration mode because it needs a considerable time to have a phase locked in the above manner. In the acceleration mode, i.e., in the state that the non-delayed input clock signal is synchronized with the external clock signal after a chip is initialized, the DLL circuit reduces a phase difference between these two clock signals by using delay values of the delay lines. The greater the phase difference between the non-delayed input clock signal and the external clock signal is, the more the delay values of the delay lines are increased.

FIG. 2 is a block diagram of another conventional register controlled DLL having an acceleration mode included in the DDR SDRAM.

The conventional register controlled DLL of the DDR SDRAM includes a first and a second input buffer 31 and 32, a first and second DLL driver 37 and 38 and a delay model 39. These elements are similar to those of the conventional register controlled DLL shown in FIG. 1.

The register controlled DLL shown in FIG. 2 further includes a first and a second phase comparators 40 and 44. The first phase comparator 40 like the phase comparator 20 shown in FIG. 1 receives a reference clock signal ref and an output clock signal fb_dm of the delay model 39, and the second phase comparator 44 receives the reference clock signal ref and an output clock signal fbclk_dly of the delay logic 43 which delays the output clock signal fb_dm of the delay model 39 for a predetermined time N×unit_delay. Herein, the N is a positive integer greater than 2, and the unit_delay is a delay value of a delay cell unit included in the first to third delay lines 34, 35 and 36. Namely, N×unit_delay is the delay value of N delay cell units.

A shift register controller 41 receives an output pd1 of the first phase comparator 40 and an output ac_enz of the second phase comparator 44. A shift register 42 receives the shift control signals SR and SL which are outputted form the shift register controller 41.

FIG. 3 is a diagram showing operation timing of the register controlled DLL shown in FIG. 2. At an initial execution, if a phase difference Td between the reference clock signal ref and the output clock signal fb_dm of the delay model 39 is greater than the delay time N×unit_delay of the delay logic 43, the outputs pd1 and ac_enz of the first and second phase comparator 40 and 44 become low. Then, if the acceleration mode enable signal ac_enz outputted from the phase comparator 44 is enabled, the shift register controller 41 allows the shift register 42 to be operated in the acceleration mode.

As reference, the first and the second phase comparators 40 and 44 compare rising edges of two signals supplied to a reference terminal and an input terminal to output a logic low signal if the phase of the signal supplied to the input terminal is faster than that of the signal supplied to the reference terminal. If otherwise, the first and the second phase comparators 40 and 44 output the logic high signal.

In the meantime, if the acceleration mode is carried out once, the phase difference Td between the reference clock signal ref and the output clock signal fb_dm of the delay model 39 is reduced. At that time, if the phase difference Td is greater than the delay time N×unit_delay of the delay logic 43, the acceleration mode is performed again by enabling the acceleration mode enable signal. Otherwise, the acceleration mode is terminated by disabling the acceleration mode enable signal ac_enz and the normal mode is performed by the output pd1 of the first phase comparator 40.

However, in the prior art, there is the problem that inputted clock signals of the first and the second phase comparators 40 and 44 are supplied with not the non-delayed input clock signal rclk but the reference clock signal ref which divides the non-delayed input clock signal rclk by 1/M.

Although, in this case, the semiconductor memory device is easily controlled and a current consumption is reduced by using the divides clock signal, e.g., the reference clock signal ref. As the execution speed of the memory device is increased a plurality of needed timing specifications are required, an accuracy of the execution may be reduced and more complicated.

SUMMARY OF THE INVENTION

It is, therefore, an object of the present invention to provide a register controlled delayed lock loop having an acceleration mode to improve accuracy corresponding to operation speed increase of a semiconductor memory device.

In accordance with an aspect of the present invention, there is provided the register controlled delayed lock loop including a delay line having a plurality of delay cell unit for delaying an non-delayed input clock signal; a delay model for reflecting a delay condition about an actual clock signal path of the non-delayed input clock signal passing through the delay line; a delay means for delaying an output signal of the delay model for a constant time; a first phase comparator for comparing a phase of the output signal provided from the delay model with that of the non-delayed input clock signal; a second phase comparator for comparing a phase of the output signal of the delay means with that of the non-delayed input clock signal; a mode decision means for determining a continuous execution or termination of an acceleration mode in response to output signals of the first and second phase comparators; a shift register control means for outputting a left shift signal, a right shift signal and an acceleration shift signal in response to output signals of the first phase comparator and the mode decision means; and a shift register for controlling a delay value of the delay line in response to an output signal of the shift register control means.

BRIEF DESCRIPTION OF THE DRAWINGS

The above and other objects and features of the instant invention will become apparent from the following description of preferred embodiments taken in conjunction with the accompanying drawings, in which:

FIGS. 7A and 7B are timing diagrams of a first and second phase comparators in a case that an acceleration mode is terminated;

DETAILED DESCRIPTION OF THE INVENTION

The present invention relates to a method for controlling an acceleration mode by employing a technique that does not employ two clock signals which are supplied to phase comparators and compared to each other through the use of the phase comparators.

The present invention uses a non-delayed input clock signal as a clock signal source. A first phase comparator compares the non-delayed input clock signal with an output from a delay model, and a second phase comparator compares the non-delayed input clock signal with a clock signal outputted from a delay logic. The outputs of the first and second phase comparators determine whether the acceleration mode is performed or not at a mode decision logic. It is important that the execution is performed in the acceleration mode by which N delay cell units are jumped and shifted at once in a shift register, and a shifted delay value must be same to a delay value N×unit_delay of the delay logic.

Hereinafter, a semiconductor memory device according to the present invention will be described in detail referring to the accompanying drawings.

Figure 1:
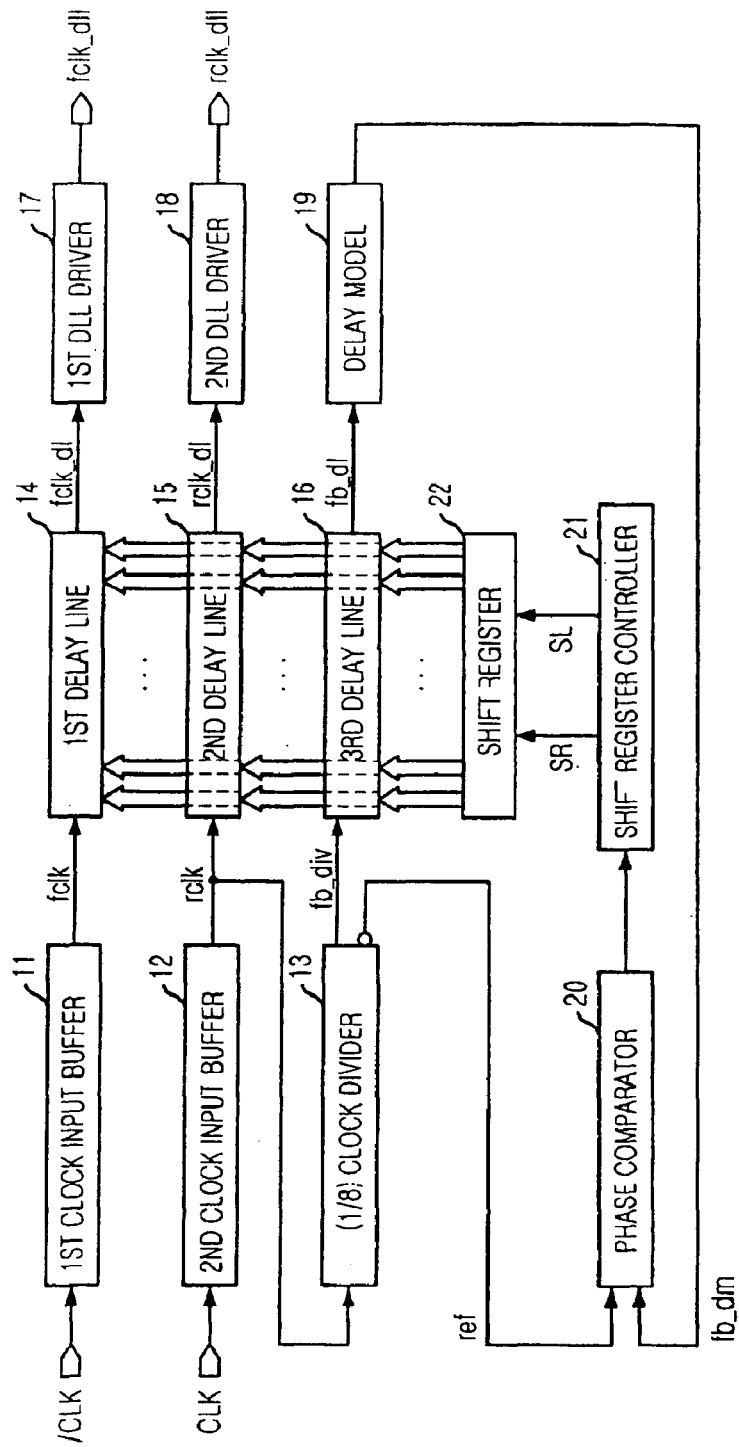
FIG. 1 is a block diagram of a conventional register controlled delayed locked loop DLL of a double data rate synchronous dynamic random access memory DDR SDRAM.
Figure 2:
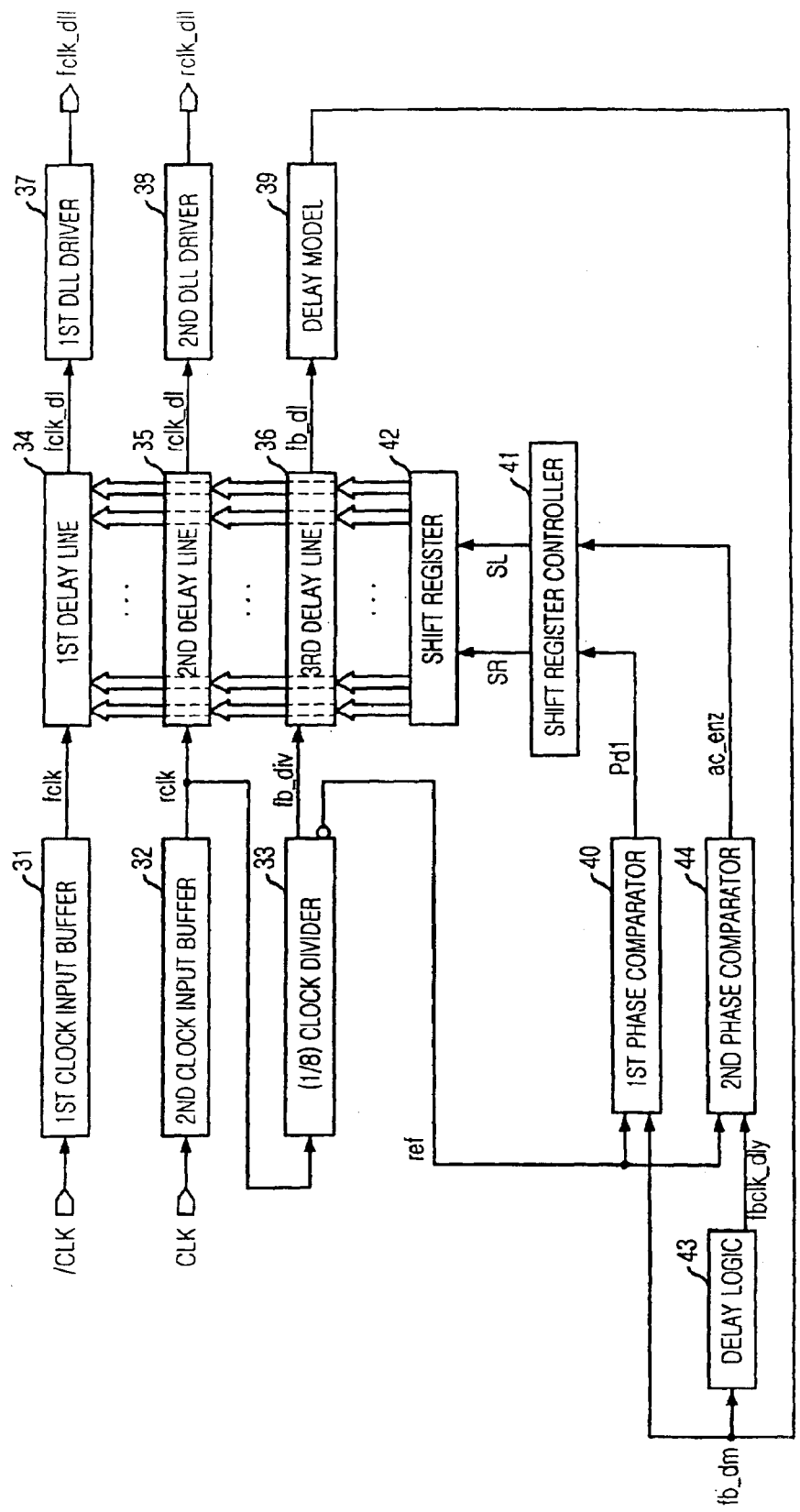
FIG. 2 is a block diagram of another conventional register controlled DLL having an acceleration mode included in the DDR SDRAM.
Figure 3:
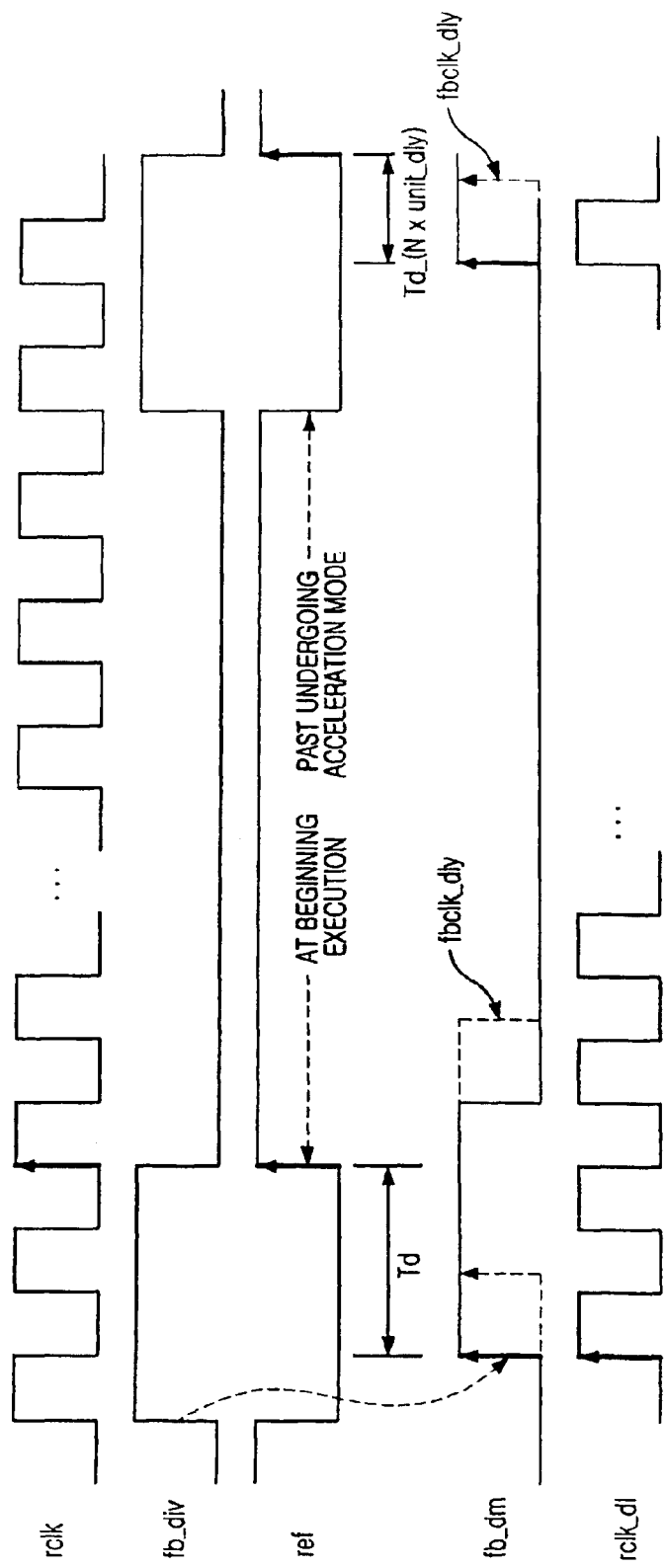
FIG. 3 is a diagram showing an operation timing of the register controlled DLL shown in FIG. 2.
Figure 4:
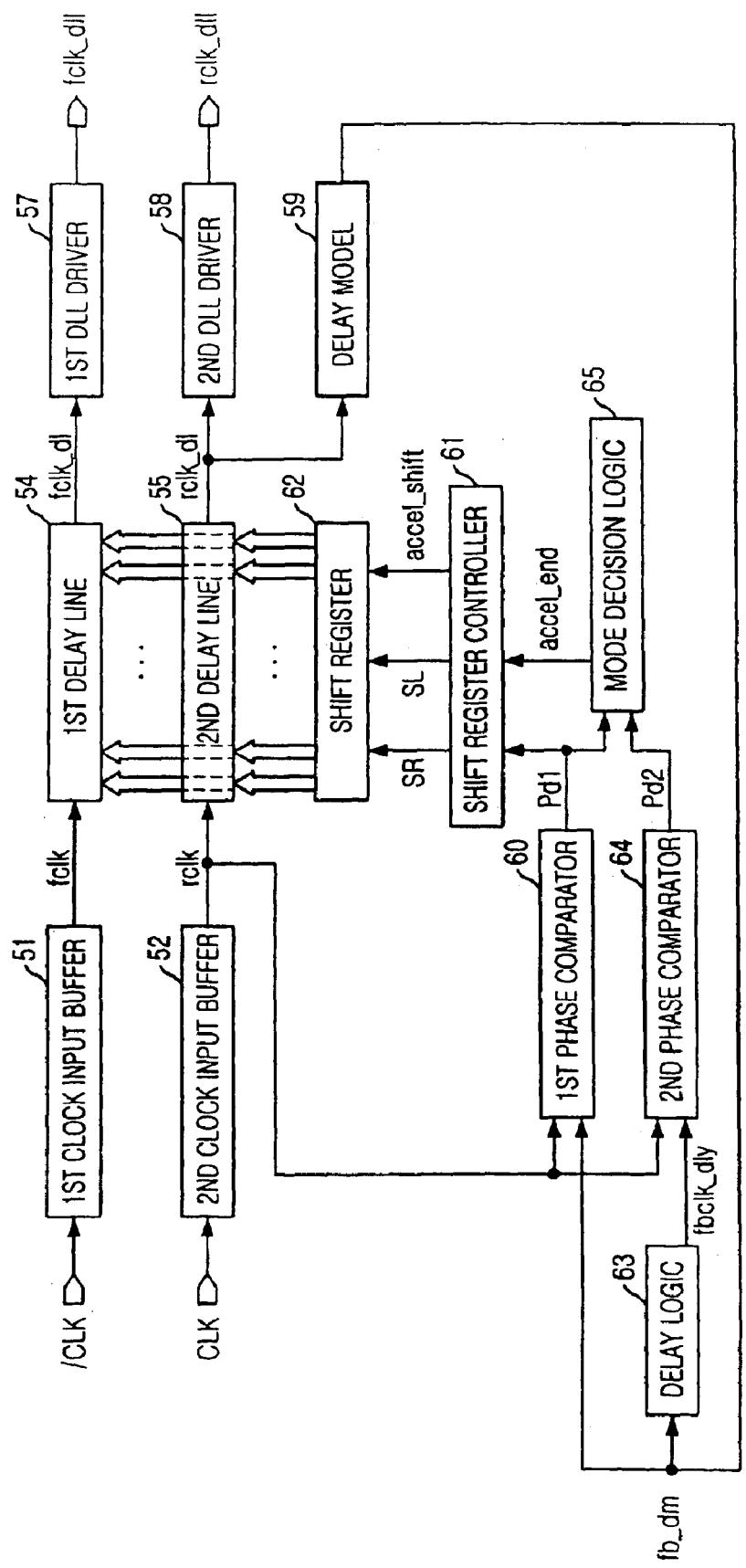
FIG. 4 is a block diagram of a register controlled DLL having an acceleration mode included in a DDR SDRAM in accordance with a preferred embodiment of the present invention.

FIG. 4 is a block diagram showing a register controlled DLL having an acceleration mode included in a double data rate synchronous dynamic random access memory DDR SDRAM in accordance with a preferred embodiment of the present invention.

As shown, the register controlled DLL uses a first and a second non-delayed input clock signals fclk and rclk outputted from a first and a second clock signal input buffers 51 and 52. After buffering a sub-external clock signal /CLK, the first clock signal input buffer 51 generates the non-delayed input clock signal fclk synchronized with a rising edge of the sub-external clock signal /CLK, i.e., a falling edge of an external clock signal CLK. The second clock signal input buffer 52 buffers the external clock signal CLK and synchronizes the second non-delayed input clock signal rclk with a rising edge of the sub-external clock signal /CLK.

The register controlled delay locked loop DLL in accordance, with the present invention includes a first delay line 54, a second delay line 55, a shift register 62, a first DLL driver 57, a second DLL driver 58, a delay model 59, a first phase comparator 60, a second phase comparator 64, a mode decision logic 65, and a shift register controller 61.

The first delay line 54 receives first the non-delayed input clock signal fclk, and the second delay line 55 does the second non-delayed input clock signal rclk. The shift register 62 determines delay values of the first and second delay lines 14 and 15. The first DLL driver 57 generates a first DLL clock signal fclk_dll after receiving an output fclk_dl of the first delay line 54. If a delay value is locked, the second DLL driver 58 generates a second DLL clock signal rclk_dll after receiving an output rclk_dl of the second delay line 55. The delay model 59 is used for reflecting delay values of a clock signal path and a data path after receiving the output rclk_dl of the second delay line 55. The delay logic 63 delays an output fb_dm of the delay model 59 for N×unit_delay. The first phase comparator 60 compares a phase of output fb_dm of the delay model 59 with a phase of the second non-delayed input clock signal rclk. The second phase comparator 64 compares a phase of the second non-delayed input clock signal rclk with that of an output fbclk_dly of the delay logic 63. The mode decision logic 65 determines whether the acceleration mode is processed or not in response to the outputs of the first and second phase comparator 60 and 64. The shift register controller 61 manages a shift mode of the shift register 62 in response to the outputs of the first phase comparator 60 and the mode decision logic 65.

As shown in FIG. 4, the register controlled DLL in accordance with the preferred embodiment has two phase comparators 60 and 64. The first and second phase comparator 60 and 64 receive directly the second non-delayed input clock signal rclk at a reference terminal. The output fb_dm of the delay model is inputted to the first phase comparator 60 while the output fbclk_dly of the delay logic 63 is inputted to the second phase comparator 64. The delay value of the delay logic 63 is N×unit_delay. The unit_delay means the delay value of the delay cell unit included in the delay lines 54 and 55.

Moreover, the register controlled DLL in accordance with the present invention uses the second non-delayed input clock signal rclk as a clock signal for generating a DLL clock signal.

The first phase comparator 60 compares the phase of the second non-delayed input clock signal rclk with that of the output fb_dm of the delay model 59. The second phase comparator 64 is used for catching a phase difference between the second non-delayed input clock signal rclk and a signal which delays the output fb_dm of the delay model 59 for the delay value N×unit_delay of the delay lines 54 and 55.

The mode decision logic 65 receives the outputs pd1 and pd2 of the two phase comparator 60 and 64. If the phase of the output fb_dm of the delay model 59 is advanced as that of the second non-delayed input clock signal rclk even though the delay value of N delay cell units in the delay line is added, i.e., the phase of the output fb_dm phase is advanced as that of the second non-delayed input clock signal rclk, the output pd1 of the first phase comparator is outputted in logical low. If the phase of the output fbclk_dly of the delay logic 63 is advanced as that of the phase of the second non-delayed input clock signal rclk, the output pd2 of the second phase comparator is outputted in logical low. If the output of the first and second phase comparators 60 and 54 are in logical low, the acceleration mode termination signal accel_end outputted from the mode decision logic 65 becomes logically low for performing the acceleration mode of the shift register controller 61. The shift register controller 61 enables the acceleration shift control signal accel-shift and delays the first and the second non-delayed input clock signals fclk and rclk inputted to the delay line 54 and 55 for delay value of N delay cell units and, then outputs the delayed input clock signals to the first and second DLL drivers.

Figure 5:
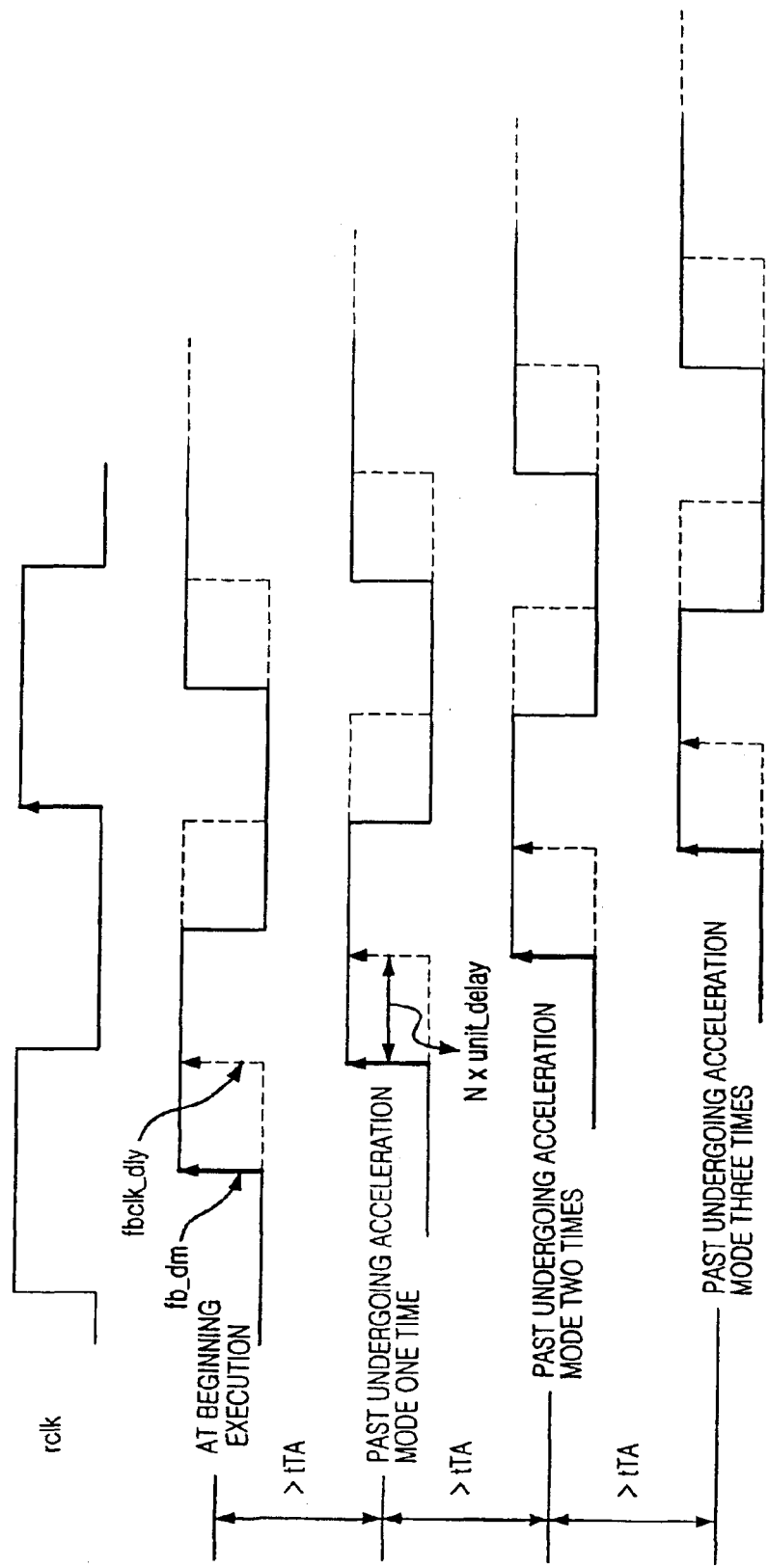
FIG. 5 is a diagram showing an operation timing of the register controlled DLL shown in FIG. 4.

FIG. 5 is a timing diagram showing operation timing of the register controlled DLL shown in FIG. 4.

The delay locked in the register controlled DLL means that the rising edge fb_dm of the delay model 59 is occurred according to the rising edge of the second non-delayed input clock signal rclk. Herein, both of the rising edges are marked in arrows in FIG. 5. The register controlled DLL makes the rising edges of two clock signals correspond with each other, because the non-delayed input clock signals are used for the clock signal source of the device or the system.

Referring to FIG. 5, the acceleration mode is enabled at the beginning execution in which the accel_end is in logical low, because the phases of the outputs fbclk_dly and fb_dm of the delay model 59 and the delay logic 63 are advanced as that of the second non-delayed input clock signal rclk. If the acceleration mode is executed in one time, the delay lines 54 and 55 delay the second non-delayed input clock signal rclk for N×unit_delay. Then the rising edge of the output fb_dm of the delay model 59 undergone one acceleration mode has the same phase to that of the output fbclk_dly of the delay logic 63. The acceleration mode is continuously executed if the rising edges of the output fbclk_dly and fb_dm of the delay model 59 and the delay logic 63 is advanced as that of the second non-delayed input clock signal rclk. After executing the acceleration mode three times, the acceleration mode should be terminated, that is, the accel_end is in logical low. The reason for this termination is because the second non-delayed input clock signal rclk is advanced in phase as the output fbclk_dly of the delay logic 63.

In the mean time, there must be a time interval between the acceleration modes. The time interval is larger than the sum tTA adding a time that the second non-delayed input clock signal rclk passes through the first and the second delay lines 54 and 55, a time that the outputs of the first and the second delay line 55 passes through the delay model 59, and a time that the output of the delay model 59 passes through the delay logic 63 and the second phase comparator 64. The reason for this requirement about the time interval is to determine whether the acceleration mode is continuously executed or immediately terminated after the outputs pd1 and pd2 of the first and second phase comparator 60 and 64 are newly updated. The updating is performed as follows: the delay execution is occurred at the delay line; and the output of the delay line passes through the delay mode 59, the delay logic 63 and the second phase comparator 64 if the acceleration mode is executed one time. If the time interval is independent on the acceleration mode, the DLL is maloperated because the pd1 and pd2 are not generated by comparing the upgraded signals of which phase is changed by the last acceleration mode in the first and the second phase comparators 60 and 64.

Figure 6:
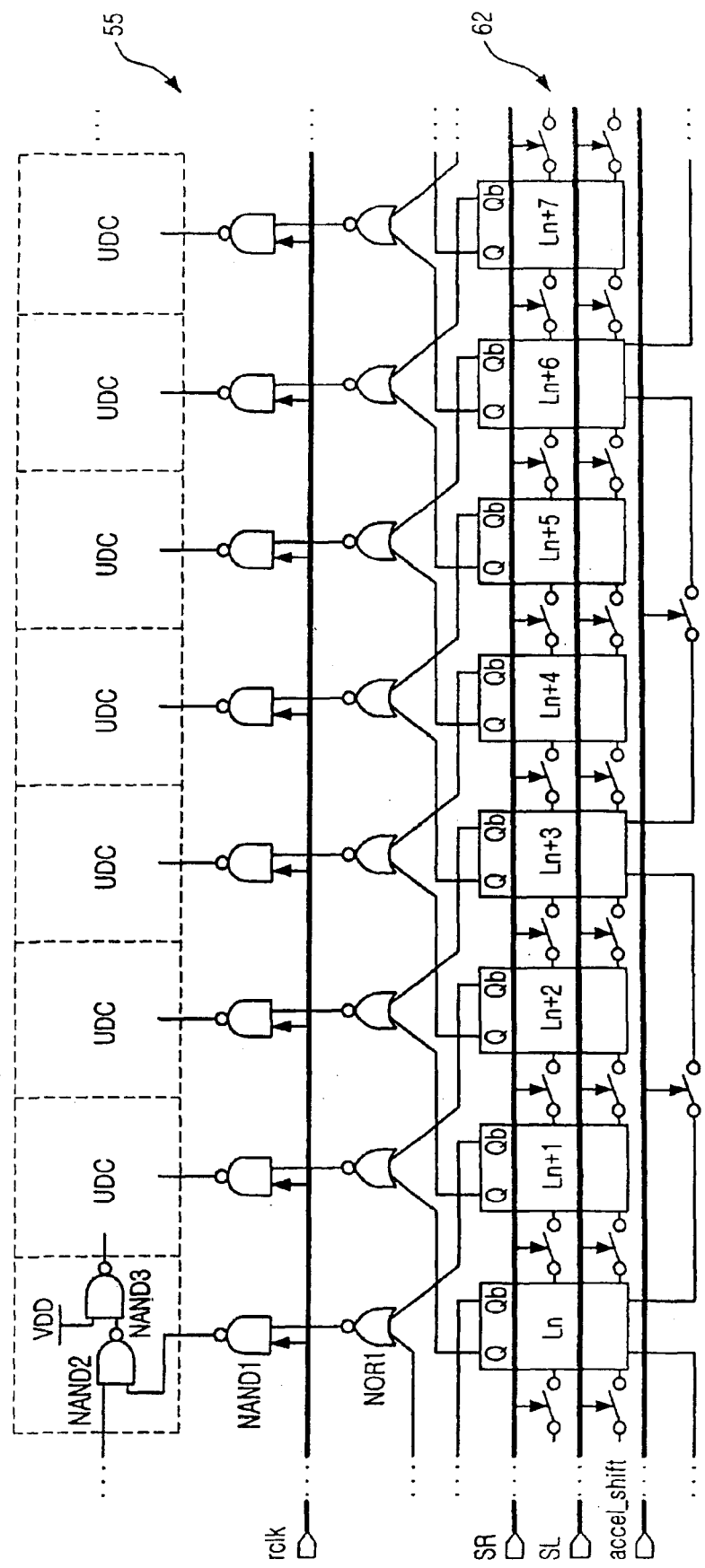
FIG. 6 is a circuit diagram of a shift register and a second delay line shown in FIG. 4.

FIG. 6 is an exemplary circuit diagram of the shift register 62 and the second delay line 55 shown in FIG. 4.

As shown, the shift register 62 includes a plurality of latches Ln to Ln+7 that individually have an output terminal Q, a sub output terminal Qb and a reset terminal (not shown) Meanwhile, the latch is connected to the neighboring latch through a switch for controlling a value of each latch, namely for inducing the shift execution between the latches. Especially, the switch is controlled by the shift control signals SR and SL outputted from the shift register controller 61. Using the switch, the output of the latch is coupled to that of the neighboring latch which is separated by N, e.g., 3. The switch is also controlled by an acceleration shift control signal accel-shift outputted from the shift register controller 61.

Moreover, the shift register 62 further includes a plurality of NOR gates corresponding to each of the latches Ln to Ln+7 for selecting one of the unit delay cells. For example, the Nth NOR gate NOR1 receives the sub output Qb of the N−1th latch (not shown) and the output Q of n+1th latch.

In addition, the second delay line 55 includes a plurality of NAND gates NAND1 and unit delay cells UDC. The NAND gate NAND1 receives the output of the NOR gate NOR1 and the second non-delayed input clock signal rclk. Each unit delay cell UDC has a NAND gate NAND2 which receives the output of the NAND gate NAND1 and a prior unit delay cell; and a NAND gate NAND3 which receives the supply voltage VDD and the output of the NAND gate NAND2. The unit delay cell serves as propagating an output of the NAND gates, e.g., NAND1.

Furthermore, the organization of the first delay line 54 is similar to that of the second delay line 55 except for the input clock signal.

The operation of the circuit shown in FIG. 6 will be described hereinafter in detail.

If a chip is initialized, each latch of the shift register 62 is also initialized. Then, the DLL operates the initial execution. The outputs Pd1 and Pd2 of the first and second phase comparators 60 and 64 lead the mode decision logic 65 to decide whether to execute or terminate the acceleration mode by enabling or disabling the acceleration termination signal accel_end. If the acceleration mode is terminated by enabling the acceleration termination signal accel_end, the normal mode is executed by outputting the unit shift control signals SR and SL from the shift register controller 61 in response to the output Pd1 of the first phase comparator 60.

The shift register 62 makes one of the plurality of the NOR gates output a logic high signal in logical high. The second non-delayed input clock signal rclk can pass through a NAND gate connected to the one. A unit delay cell UDC connected to the NAND gate is selected. If the unit delay model is selected in the above manner, a number of the unit delay cells UDC, which the second non-delayed input clock signal rclk passes through, is determined.

The SR signal outputted from the shift register controller 61 makes the output of the latch delivered to the neighboring latch on the right, and the SL signal outputted from the shift register controller 61 makes the output of the latch delivered to the neighboring latch on the left. The acceleration shift control signal accel_shift makes the output of a latch delivered to a left-sided neighboring latch located N from the latch. For instance., assuming that the second non-delayed input clock signal rclk is outputted throughout S numbers of the unit delay cells UDC, the number of the unit delay cells UDC which pass the non-delayed input clock signal rclk are S−1 if the SR is active. On the other hand, if the SL is active, the number of the unit delay cells, UDC are S+1. If the acceleration shift control signal accel-shift is active, the the number of the unit delay cells UDC are S+N.

The following Table 1 is a true/false table of the mode decision logic 65.

TABLE 1

True/False Table of the mode decision logic

| Present accel_end | pd1 | pd2 | last pd2 | Next accel_end |
| --- | --- | --- | --- | --- |
| 1 | Don't care | | | 1 |
| 0 | 0 | 1 | X | 1 |
| 0 | Don't care | 1 | 0 | 1 |
| 0 | Anything else (& reset value) | | | 0 |

Referring to Table 1, a initial value of the acceleration mode termination signal accel_end is 0. This value means that the acceleration mode can be executed. If the acceleration mode termination signal accel_end has a initial value of 1, the acceleration mode is terminated because the non-delayed input clock signal rclk is close to the output fb_dm of the delay model 59. The DLL is ready to execute the acceleration mode at the beginning because the value of the acceleration mode termination signal accel_end is 0.

In more detail, if the present acceleration mode termination signal accel_end is 1, the next acceleration mode termination signal accel_end is 1 regardless of the pd1, the pd2 and the last pd2.

Next, if present acceleration mode termination signal accel_end is 0, the value of next acceleration mode termination signal accel_end is variable in response to the pd1, the pd2 and the last pd2.

Figure 7A:
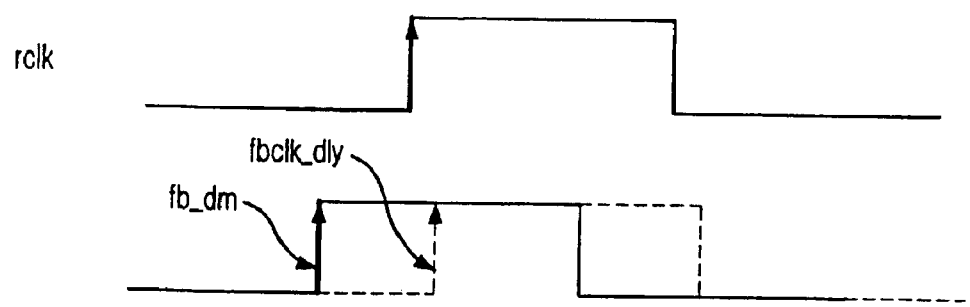

FIG. 7A is a timing diagram of the first and the second phase comparators 60 and 64 in case that the pd1 is 0 and the pd2 is 1 to thereby represent the waveform at a moment of terminating the acceleration mode. At this time, the next acceleration mode termination signal accel_end is 1 regardless of the last pd2. This value means that the acceleration mode is terminated.

FIG. 7B is a timing diagram of the two phase comparators 60 and 64 in case that the pd2 is 1 and the last pd2 is 0 to thereby represent the waveform after undergoing k times the acceleration mode and the waveform after undergoing k+1 times the acceleration mode. Though the pd1 and pd2 are all 0 after undergoing k times the acceleration mode, there can be occurred a little phase difference between the rising edge of the output of the delay model 63 and that of the non-delayed input clock signal rclk. In this case, the phase of the output fb_dm provided from the delay mode 59 after undergoing k+1 times the acceleration mode should be the same to that of the output fbclk_dly provided from the delay logic 63 after undergoing k times the acceleration mode. However, the delay value, i.e., N×unit_delay of the delay logic 63 located in a foregoing part of the second phase comparator 64 has a minute difference with that of N number of the unit delay cells UDC of the delay lines 54 and 55, because the difference in each input and output conditions, i.e., an input slope and an output loading. Thus, after executing k+1 times the acceleration mode, the phases of the outputs fbclk_dly of the delay logic 63 and the output fb_dm of the delay model 59 can be delayed as the phase of the second non-delayed input clock signal rclk. In above case, the DLL should terminate the acceleration mode immediately. It is also noted that the case shown in FIG. 7A can not cover the case shown in FIG. 7B. As a result, in case that the pd2 is 0 after executing k times the acceleration mode and the pd2 is 1 after executing k+1 times the acceleration mode, the acceleration mode is terminated because the acceleration mode termination signal accel_end is 1.

In all cases except for the cases described above, the acceleration mode can be executed like the state that the acceleration mode termination signal accel_end is 0.

Meanwhile, the mode decision logic 65 has a latch at the input terminal that receives the pd2 signal for perceiving the former state of the pd2 and the output terminal that outputs the acceleration mode termination signal accel_end for maintaining the break of the acceleration mode.

Figure 8:
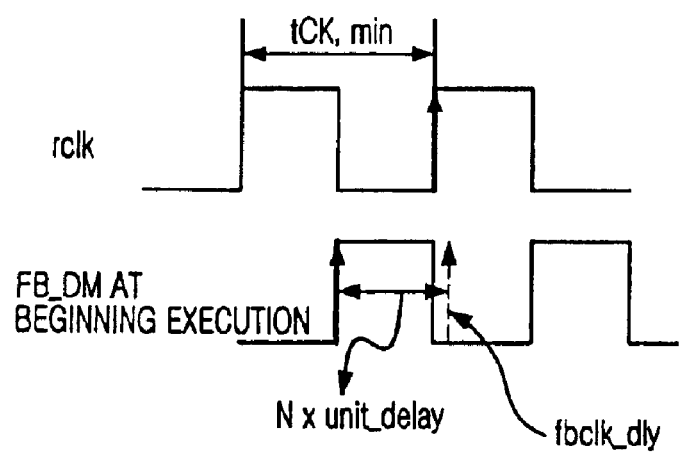
FIG. 8 describes a timing diagram showing a range of N value that determines a delay value of a delay logic shown in FIG. 4.

FIG. 8 is a diagram showing a range of the N determining a delay value N×unit_delay of a delay logic shown in FIG. 4.

In the present invention, the DLL should perceive what time the acceleration mode is terminated in a bad condition that a rising edge occurs at every 1 tCK, because of usage of a free-running clock signal instead of a divided clock signal. The acceleration mode should not be executed if the delay value N×unit_delay of the delay logic 63 is larger than a half period of a maximum frequency signal as reference value. However, the acceleration mode is executed because the acceleration mode termination signal accel_end is 0. Namely, a maloperation occurs when the rising edge of the output fb_dm of the delay model 59 corresponds to a period that the non-delayed input clock signal rclk is in a logical high state and the rising edge of the output fbclk_dly of the delay logic 63 corresponds to a period that the non-delayed input clock signal rclk is in a logical low state. The reason for this maloperation is because the two phase comparators 60 and 64 cannot perceive whether the rising edge of the fb_dm and that of the fbclk_dly occur in the same period that the second non-delayed input clock signal rclk is in a logical high state. Thus, an approved range of N is determined to be lower than a half period (½ ×tCK,min) of the maximum operating frequency signal, which is the reference for the delay value N×unit_delay of the delay logic 63.

For instance, assuming that the maximum operating frequency of the operating signal is 333 MHz, i.e., tCK,min=3 ns, and the delay value of the unit delay cell UDC is 150 ps, the following equation 1 is formulated. ½×3 ns>N×150 ps (Eq. 1) This equation indicates that N is less than 10.

Figure 9:
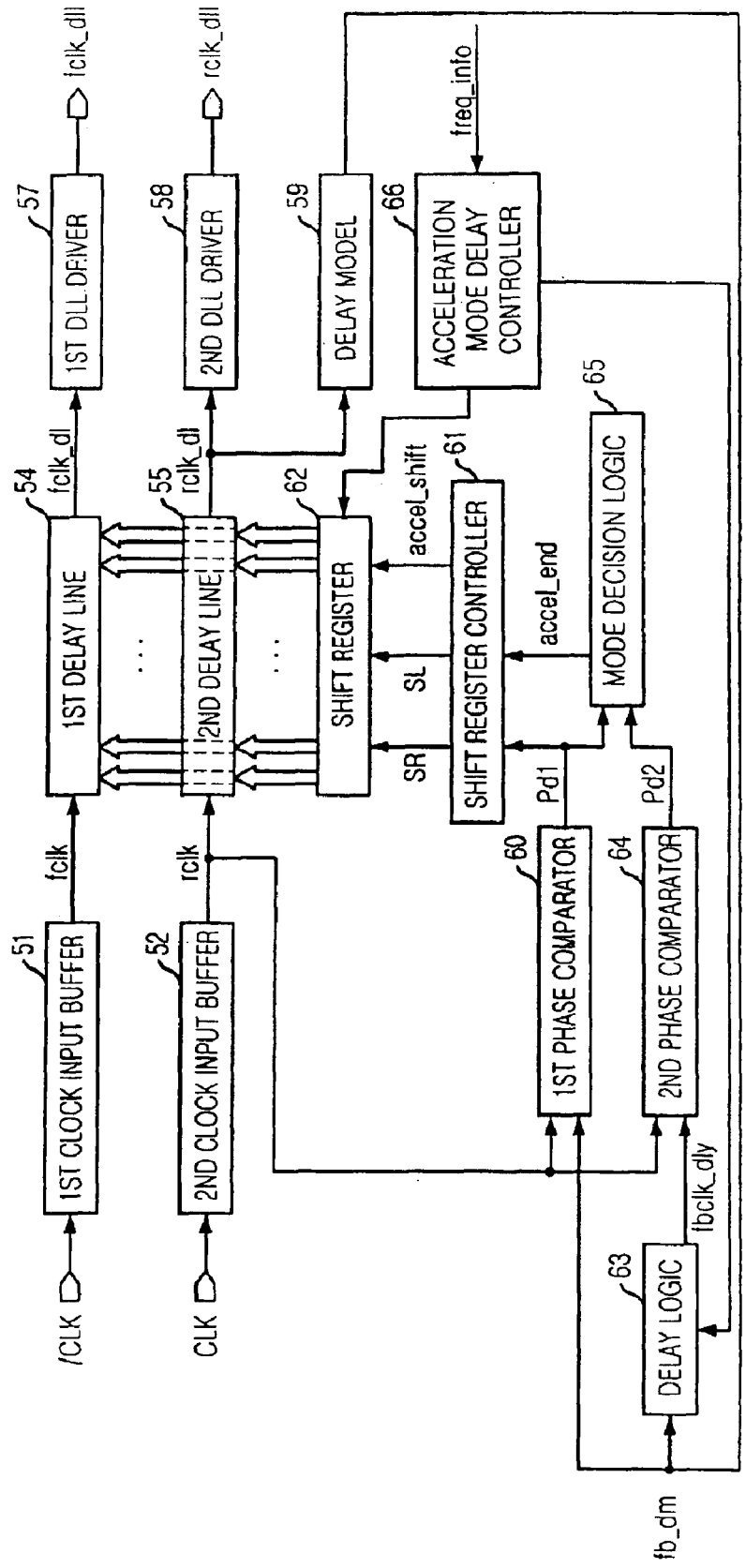
FIG. 9 is a block diagram showing a register controlled DLL having acceleration mode in accordance with another embodiment of the present invention.

FIG. 9 is a block diagram showing a register controlled DLL having acceleration mode in accordance with another embodiment of the present invention.

As shown, the register controlled DLL having acceleration mode has a similar structure of the inventive DLL shown in FIG. 4. Therefore, the like reference numbers used in FIG. 4 are used in the like elements of FIG. 9.

However, the preferred embodiment of the present invention further includes an acceleration mode delay controller 66 for controlling the unit delay value of a shift register 62 in the acceleration mode according to an operation frequency information signal freq_info along with the DLL structure of FIG. 4.

The acceleration mode delay controller 66 controls N for the unit delay value 'N×unit_delay'. That is, the N is controlled according to the operation frequency of the system in accordance with the preferred embodiment of the present invention.

Index closely related to the operation frequency information signal freq_info is used for finding the operation frequency and the acceleration mode single delay controller 66 is required to have N value corresponding to the operation frequency information signal freq_info.

The CAS latency or a mode register setting value is used for generating the operation frequency information signal freq_info in case of synchronous semi-conductor memory device.

First of all, a method using the CAS latency is explained as follows.

Generally, when the operation frequency of the semi-conductor memory device is high, a larger value of the CAS latency is chosen; and when the operation frequency of the semi-conductor memory device is low, a small value of the CAS latency CL is chosen.

It is assumed that operation frequency rages for the CAS latencies 2, 3 and 4 are shown as:
CL=2: 100 MHz~200 MHz
CL=3: 200 MHz~200 MHz
CL=4: 300 MHz~400 MHz.

For example, if the CL is 2, maximum operation frequency is 200 MHz (tCK,current=5 ns). When the maximum operation frequency 200 MHz is applied to the Eq. 1, N<12.5 is outputted. Using the same equation, when the CL is 3, N<8.25 is outputted and when the CL is 4, N<6.25 is outputted. Because the condition of the maximum operation frequency for each frequency range is satisfied and the value N is required to be a maximum value, when the CL is 2, the value N is chosen as 12, when the CL is 3, the value N is chosen as 8 and when the CL is 4, the value of N is chosen as 6. Therefore, the value N is varied according to the current operation frequency in order to execute the acceleration mode.

Secondly, a method using the mode register setting value is explained as follows.

Generally, the mode register determines entire modes of the memory operation in the semi-conductor memory device and a specific bit not used currently in the mode register can be used as information determining the value N in the acceleration mode.

Two bits such as an A9 and an A10 are used for determining the value N and it is assumed that decoding values for the A9 and the A10 are as follows:
A10, A9='00': N=12
A10, A9='01': N=8
A10, A9='10': N=6

If the A10 or A9 is set by using an instruction such as mode register set (MRS) during initializing of the semiconductor memory device, the acceleration mode of the DLL circuit is executed at the value N corresponding to 2 bits of the A9 and the A10. For example, the A10 and the A9 is set as '00' in the lowest operation frequency band and the A10 and the A9 is set as '10' in the highest operation frequency band.

It has been assumed that the value N has three cases such as 12, 8 and 6 in the present invention. The shift register 62 is required to be designed to vary the value N.

As mentioned above, increase of the delay locking time is prevented by controlling single delay amount in the acceleration mode in accordance with the present invention.

In addition, the present invention does not use the clock signal divider, and thus, layout areas of the register controlled DLL are reduced because the delay line is unnecessary for monitoring the clock signal delay.

The present invention improves accuracy by maintaining the delay locked time even in case that an operation speed is increased, and this improvement further enhances a device capability. Also, layout areas of the chip are reduced because a number of the delay lines are decreased without using the clock signal divider.

For example, in the preferred embodiments of the present invention, there is the explanation on the case that the non-delayed input clock signal rclk synchronized with the rising edge of the external clock signal CLK is used as the clock signal source; moreover, the present invention can be applied to a case that the non-delayed input clock signal rclk synchronized with the falling edge of the external clock signal CLK.

Also, the register controlled DLL in accordance with the present invention is applied not only to DDR SDRAM but also to other synchronized semiconductor memory device and a other synchronized logic circuit.

In addition, there is the explanation on the case that the delay value of the delay logic is the same to that of the delay line shifted due to the acceleration mode. However, the value of the delay line jumped by the acceleration mode should exceed that of the delay logic.

While the present invention has been described with respect to the particular embodiments, it will be apparent to those skilled in the art that various changes and modifications may be made without departing from the spirit and scope of the invention as defined in the following claims.

What is claimed is:

1. A register controlled delayed lock loop for use in a semiconductor memory device, comprising:
    a delay line having a plurality of delay cell units for delaying a non-delayed input clock signal;
    a delay model, which receives the signal outputted from the delay line, for reflecting a delay condition for an actual clock signal path of the non-delayed input clock signal passing through the delay line;
    a delay means for delaying an output signal of the delay model for a predetermined time;
    an acceleration mode delay controller for controlling the delay value in an acceleration mode according to operation frequently information;
    a first phase comparator for comparing a phase of the output signal provided from the delay model with that of the non-delayed input clock signal;
    a second phase comparator for comparing a phase of the output signal of the delay means with that of the non-delayed input clock signal;
    a mode decision means for determining a continuous execution or termination of the acceleration mode in response to output signals of the first and second phase comparators;
    a shift register control means for outputting a left shift signal, a right shift signal and an acceleration shift signal in response to output signals of the first phase comparator and the mode decision means; and
    a shift register for controlling a delay value of the delay line in response to output signals of the shift register control means and the acceleration mode delay controller.

2. The register controlled delayed lock loop as recited in claim 1 wherein a delay value of the delay means is the same as that of the delay line increased in response to the acceleration shift signal.

3. The register controlled delayed lock loop as recited in claim 2, wherein the shift register includes:
    a plurality of latches, each having a reset terminal, an output terminal and a sub-output terminal;
    a plurality of first switches for supplying a value of the latch to a neighboring latch on the left in response to the left shift signal;
    a plurality of second switches for supplying a value of the latch to a neighboring latch on the right in response to the right shift signal; and
    a plurality of third switches for supplying a value of the latch to another latch separated with a predetermined distance in response to the acceleration shift signal.

4. The register controlled delayed lock loop as recited in 2, wherein the delay value of the delay means is a multiplication of the delay value of the delay cell unit by a predetermined times.

5. The register controlled delayed lock loop as recited in claim 4, wherein the delay value of the delay means is smaller than a half period of the non-delayed input clock signal.

6. The register controlled delayed lock loop as recited in claim 1, the operation frequency information is generated by using a column address strobe latency (CAS latency).

7. The register controlled delayed lock loop as recited in claim 6, the operation frequency information is generated by using a mode register setting value in case of synchronous semi-conductor memory device.

8. A semiconductor memory device including a delay locked loop, comprising:
    a delay line having a plurality of delay cell units for delaying a non-delayed input clock signal;
    a delay model, which receives the signal outputted from the delay line, for reflecting a delay condition for an actual clock signal path of the non-delayed input clock signal passing through the delay line;
    a delay means for delaying an output signal of the delay model for a predetermined time;
    an acceleration mode delay controller for controlling the delay value in an acceleration mode according to operation frequency information;
    a first phase comparator for comparing a phase of the output signal provided from the delay model with that of the non-delayed input clock signal;
    a second phase comparator for comparing a phase of the output signal of the delay means with that of the non-delayed input clock signal;
    a mode decision means for determining a continuous execution or termination of the acceleration mode in response to output signals of the first and second phase comparators;
    a shift register control means for outputting a left shift signal, a right shift signal and an acceleration shift signal in response to output signals of the first phase comparator and the mode decision means; and a shift register for controlling a delay value of the delay line in response to output signals of the shift register control means and the acceleration mode delay controller.

9. The semiconductor memory device of claim 8, wherein a delay value of the delay means is the same as that of the delay line increased in response to the acceleration shift signal.

10. The semiconductor memory device of claim 9, wherein the delay value of the delay means is a multiplication of the delay value of the delay cell unit by a predetermined times.

11. The semiconductor memory device of claim 10, wherein the delay value of the delay means is smaller than a half period of the non-delayed input clock signal.

12. The semiconductor memory device of claim 8, wherein the shift register includes:

a plurality of latches, each having a reset terminal, an output terminal and a sub-output terminal;

a plurality of first switches for supplying a value of the latch to a neighboring latch on the left in response to the left shift signal;

a plurality of second switches for supplying a value of the latch to a neighboring latch on the right in response to the right shift signal; and a plurality of third switches for supplying a value of the latch to another latch separated with a predetermined distance in response to the acceleration shift signal.

* * * * *

UNITED STATES PATENT AND TRADEMARK OFFICE
CERTIFICATE OF CORRECTION

PATENT NO. : 6,853,226 B2  Page 1 of 1
DATED : February 8, 2005
INVENTOR(S) : Jong-Tae Kwak et al.

It is certified that error appears in the above-identified patent and that said Letters Patent is hereby corrected as shown below:

Column 11
Line 58, after "operation" please delete "frequently" and insert -- frequency -- in its place.

Column 12,
Lines 28-29, after "lock loop as recited" please delete "in 2" and insert -- in claim 2 -- in its place.

Signed and Sealed this

Twenty-fourth Day of May, 2005

JON W. DUDAS
*Director of the United States Patent and Trademark Office*